(12) United States Patent
Naum et al.

(10) Patent No.: US 8,088,303 B2
(45) Date of Patent: Jan. 3, 2012

(54) WARM-WHITE LIGHT-EMITTING DIODE AND ITS PHOSPHOR POWDER

(75) Inventors: Soshchin Naum, Changhua (TW); Wei-Hung Lo, Taipei (TW); Chi-Ruei Tsai, Taipei (TW)

(73) Assignees: Wei Hung Lo, Taipei (TW); Shui Sin Jiang, Taipei (TW); Jin Cheng Lin, Tainan County (TW)

( * ) Notice: Subject to any disclaimer, the term of this patent is extended or adjusted under 35 U.S.C. 154(b) by 227 days.

(21) Appl. No.: 12/463,772

(22) Filed: May 11, 2009

(65) Prior Publication Data

US 2009/0289545 A1    Nov. 26, 2009

(30) Foreign Application Priority Data

May 26, 2008 (TW) ................................ 97119326 A

(51) Int. Cl.
*C09K 11/80* (2006.01)
*C09K 11/86* (2006.01)

(52) U.S. Cl. .......................... 252/301.4 R; 252/301.4 H

(58) Field of Classification Search ........... 252/301.4 R, 252/301.4 H

See application file for complete search history.

(56) References Cited

U.S. PATENT DOCUMENTS

2009/0179212 A1 * 7/2009 Naum et al. .................. 257/98

* cited by examiner

*Primary Examiner* — Carol M Koslow
(74) *Attorney, Agent, or Firm* — Shimokaji & Associates, P.C.

(57) ABSTRACT

The present invention discloses a warm-white-light emitting diode has the substrate of indium gallium nitride (InGaN) heterojunction containing a large amount of quantum wells and having a light conversion polymer layer, characterized by that the light conversion polymer layer is uniform in concentration, the light-emitting surface and edges of the indium gallium nitride heterojunction are covered with a thermosetting polymer, and the light conversion polymer layer contains some fluorescent powders, which are formed as at least two particle layers in the light conversion polymer layer to ensure the light transmitted reaching 20% of the first-order blue light and 70~80% of the second-order orange-yellow light from the indium gallium nitride heterojunction. The present invention also discloses a fluorescent powder.

6 Claims, 6 Drawing Sheets

Spectroradiometric Analysis Report for Phosphor

Product : Y-706-1-a1-1500c-465nm-20ma
Manufacturer :
Client :
Sample No. :                                Date : August 31, 2007
Tested By :                                 Reviewed By :

Test Condition
Temperature :    °C                         RH : %
Ref. Gain : 64                              Spe. Gain : 4
Spectrum Range : 380-780 nm                 Scan Step : 5 nm Spectroradiometric Parameters Spectral Distribution Warm_White    2900K
x0=0.440    y0=0.403
L:8SDCM   M:6SDCM   S:5SDCM Chromaticity Coordinates : x=0.4367 y=0.4205 u=0.2436 v=0.3518
Correlated Color Temperature : 3133 K
Brightness : 25226.7
Reference White : C Light                   Peak Wavelenght : 571.5 nm
Dominant Wavelength : 580 nm                Bandwidth : 131.4 nm
Purity : 0.6177                             Radiant Brightness : 75.999
Color Ratio : Kr=57.8%  Kg=28.1%  Kb=14.1%
Rendering Index : Ra=68.6
R1=64   R2=80   R3=90   R4=58   R5=59   R6=66   R7=83   R8=50
R9=-22  R10=48  R11=43  R12=31  R13=66  R14=93  R15=61

SPR-920D Analyzer System for Phosphor
Spectroradiometric made by
Zhejiang University Sensing Instruments Co., Ltd.

Spectroradiometric Analysis Report for Phosphor

Product : Y-706-1-a1-1500c-465nm-20ma
Manufacturer :
Client :
Sample No. :                                          Date : August 31, 2007
Tested By :                                           Reviewed By :

Test Condition
Temperature :    °C                                   RH :   %
Ref. Gain : 64                                        Spe. Gain : 4
Spectrum Range : 380-780 nm                           Scan Step : 5 nm Spectroradiometric Parameters

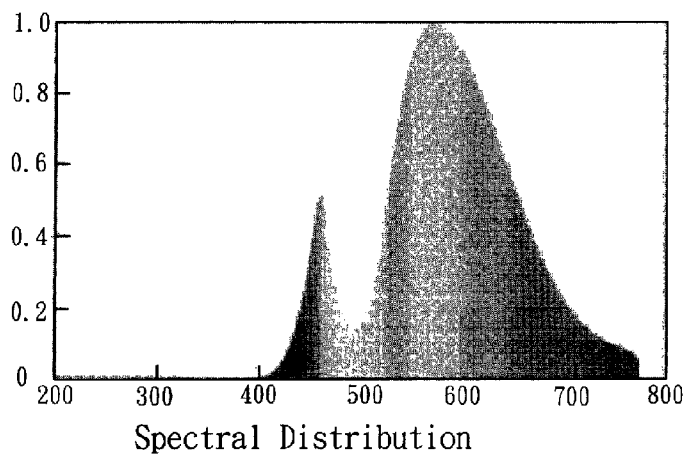 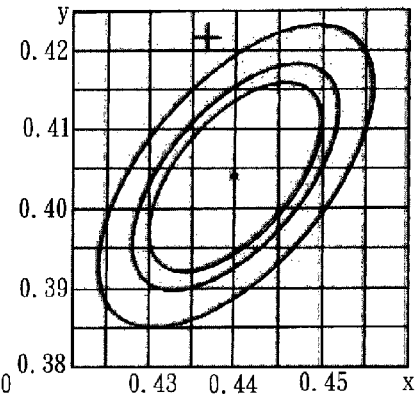

Spectral Distribution                    Warm_White    2900K
                                         x0=0.440     y0=0.403
                                         L:8SDCM   M:6SDCM   S:5SDCM Chromaticity Coordinates : x=0.4367 y=0.4205 u=0.2436 v=0.3518
Correlated Color Temperature : 3133 K
Brightness : 25226.7
Reference White : C Light                    Peak Wavelenght : 571.5 nm
Dominant Wavelength : 580 nm                 Bandwidth : 131.4 nm
Purity : 0.6177                              Radiant Brightness : 75.999
Color Ratio : Kr=57.8%  Kg=28.1%  Kb=14.1%
Rendering Index : Ra=68.6

| R1=64 | R2=80 | R3=90 | R4=58 | R5=59 | R6=66 | R7=83 | R8=50 |
|---|---|---|---|---|---|---|---|
| R9=-22 | R10=48 | R11=43 | R12=31 | R13=66 | R14=93 | R15=61 | |

SPR-920D Analyzer System for Phosphor
Spectroradiometric made by
Zhejiang University Sensing Instruments Co., Ltd.

FIG. 2

Spectroradiometric Analysis Report for Phosphor

Product : Y-705-3-w-al-1500c-465nm-20ma
Manufacturer :
Client :
Sample No. :                                    Date : August 31, 2007
Tested By :                                     Reviewed By :

Test Condition
Temperature :        °C                         RH : %
Ref. Gain : 64                                  Spe. Gain : 4
Spectrum Range : 380-780 nm                     Scan Step : 5 nm Spectroradiometric Parameters

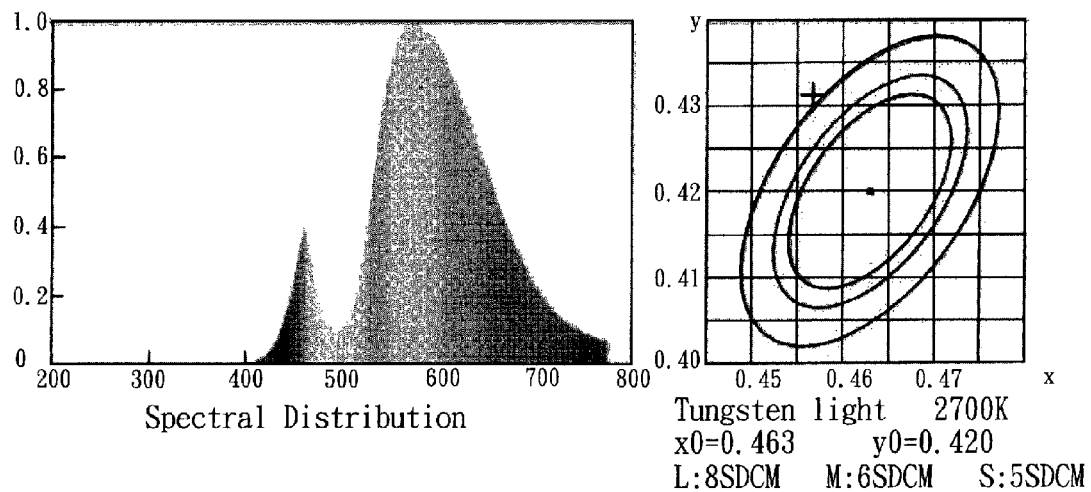

Spectral Distribution         Tungsten light   2700K
                              x0=0.463    y0=0.420
                              L:8SDCM   M:6SDCM   S:5SDCM Chromaticity Coordinates : x=0.4567 y=0.4312 u=0.2516 v=0.3563
Correlated Color Temperature : 2901 K
Brightness : 25032.2
Reference White : C Light             Peak Wavelenght : 572.0 nm
Dominant Wavelength : 580 nm          Bandwidth : 129.0 nm
Purity : 0.7017                       Radiant Brightness : 74.454
Color Ratio : Kr=61.2%  Kg=28.0%  Kb=10.8%
Rendering Index : Ra=64.9

| R1=59  | R2=76  | R3=88  | R4=54  | R5=54  | R6=60  | R7=82  | R8=45 |
|--------|--------|--------|--------|--------|--------|--------|-------|
| R9=-31 | R10=42 | R11=36 | R12=22 | R13=61 | R14=93 | R15=57 |       |

SPR-920D  Analyzer System for Phosphor
Spectroradiometric made by
Zhejiang University Sensing Instruments Co., Ltd.

FIG. 3

Spectroradiometric Analysis Report for Phosphor

Product : Y-707-3-al-1500c-465nm-20ma
Manufacturer :
Client :
Sample No. :                                    Date : August 31, 2007
Tested By :                                     Reviewed By :

Test Condition
Temperature :    °C                             RH : %
Ref. Gain : 64                                  Spe. Gain : 4
Spectrum Range : 380-780 nm                     Scan Step : 5 nm Spectroradiometric Parameters

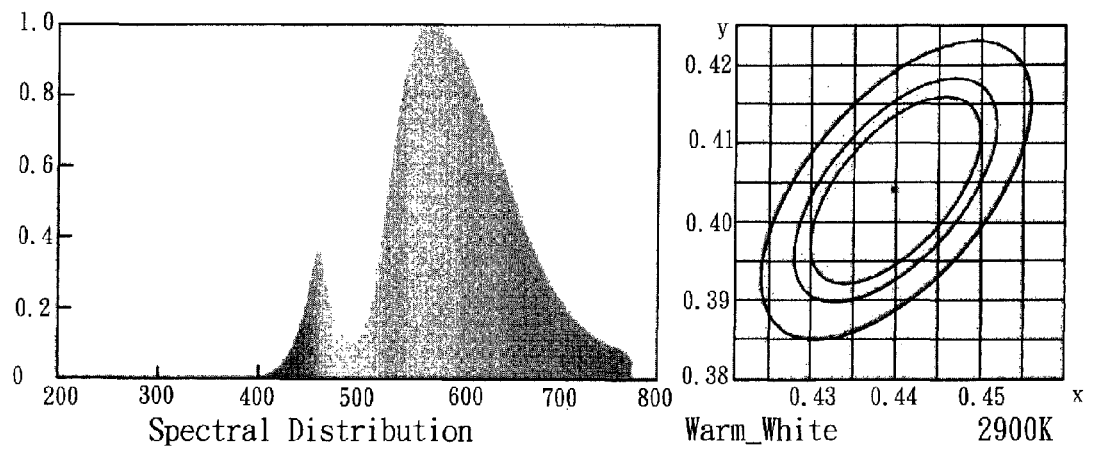

Spectral Distribution                           Warm_White          2900K
                                                x0=0.440    y0=0.403
                                                L:8SDCM    M:6SDCM    S:5SDCM Chromaticity Coordinates : x=0.4581  y=0.4355  u=0.2507  v=0.3575
Correlated Color Temperature : 2912 K
Brightness : 23948.4
Reference White : C Light                       Peak Wavelenght : 578.4 nm
Dominant Wavelength : 580 nm                    Bandwidth : 129.9 nm
Purity : 0.7159                                 Radiant Brightness : 70.834
Color Ratio : Kr=61.3%  Kg=28.3%  Kb=10.4%
Rendering Index : Ra=65
R1=59    R2=76    R3=88    R4=55    R5=54    R6=60    R7=83    R8=46
R9=-31   R10=41   R11=37   R12=20   R13=61   R14=92   R15=57

SPR-920D Analyzer System for Phosphor
Spectroradiometric made by
Zhejiang University Sensing Instruments Co., Ltd.

FIG. 4

Spectroradiometric Analysis Report for Phosphor

Product : Y-705-6-w-al-1500c-465nm-20ma
Manufacturer :
Client :
Sample No. :                                         Date : August 31, 2007
Tested By :                                          Reviewed By :

Test Condition
Temperature :      °C                                RH : %
Ref. Gain : 64                                       Spe. Gain : 4
Spectrum Range : 380-780 nm                          Scan Step : 5 nm Spectroradiometric Parameters

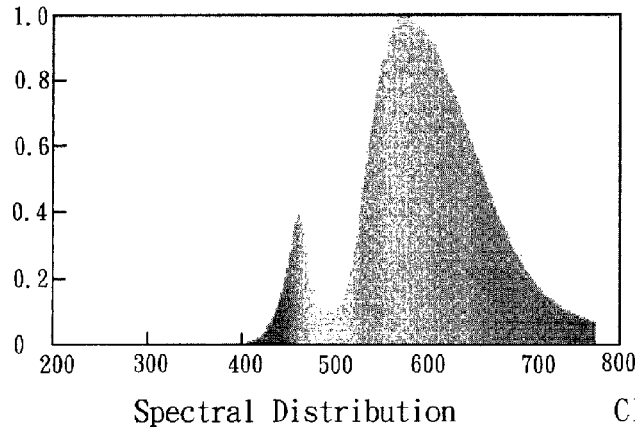
Spectral Distribution

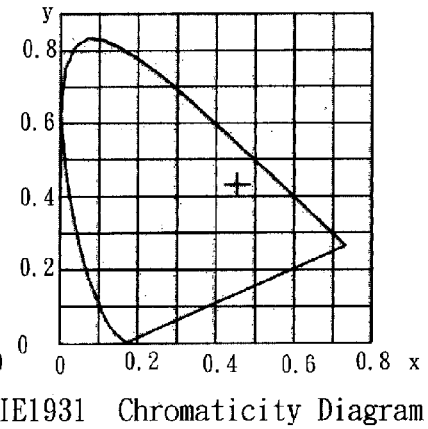
CIE1931 Chromaticity Diagram

Chromaticity Coordinates : x=0.4559 y=0.4308 u=0.2513 v=0.3561
Correlated Color Temperature : 2910 K
Brightness   : 24871.9
Reference White : C Light                    Peak Wavelenght : 579.1 nm
Dominant Wavelength : 580 nm                 Bandwidth : 129.3 nm
Purity : 0.6984                              Radiant Brightness : 74.17
Color Ratio : Kr=61.1%  Kg=28.0%  Kb=10.9%
Rendering Index : Ra=65.2
R1=60    R2=77    R3=88    R4=54    R5=54    R6=61    R7=82    R8=45
R9=-30   R10=42   R11=36   R12=22   R13=62   R14=93   R15=57

SPR-920D Analyzer System for Phosphor
Spectroradiometric made by
Zhejiang University Sensing Instruments Co., Ltd.

FIG. 5

Spectroradiometric Analysis Report for Phosphor

Product : Y-690-2-w-al-1500c-465nm-20ma
Manufacturer :
Client :
Sample No. :                          Date : August 31, 2007
Tested By :                           Reviewed By :

Test Condition
Temperature :           °C            RH : %
Ref. Gain : 64                        Spe. Gain : 4
Spectrum Range : 380-780 nm           Scan Step : 5 nm Spectroradiometric Parameters

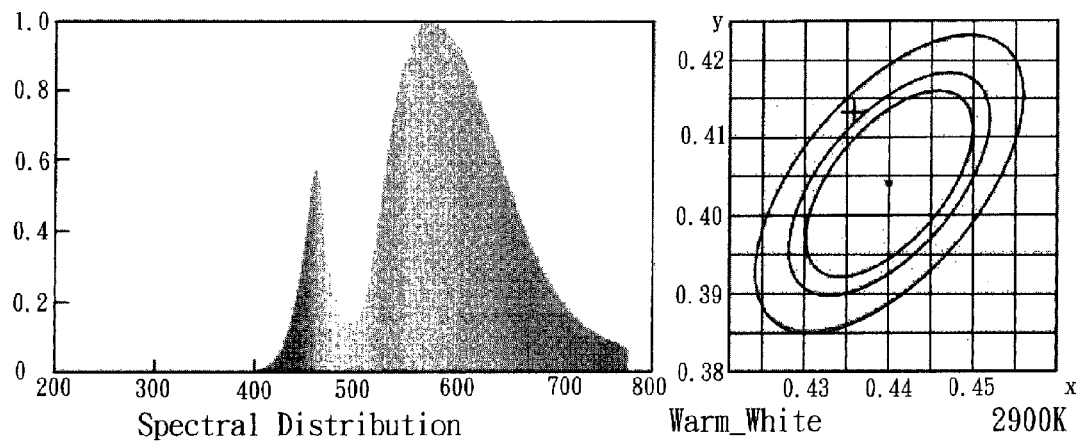

Spectral Distribution          Warm_White            2900K
                               x0=0.440      y0=0.403
                               L:8SDCM   M:6SDCM   S:5SDCM Chromaticity Coordinates : x=0.4358 y=0.4122 u=0.2464 v=0.3496
Correlated Color Temperature : 3085 K
Brightness : 23661.7
Reference White : C Light            Peak Wavelenght : 582.3 nm
Dominant Wavelength : 581 nm         Bandwidth : 131.6 nm
Purity : 0.5928                      Radiant Brightness : 72.854
Color Ratio : Kr=58.3%  Kg=27.0%  Kb=14.7%
Rendering Index : Ra=69.8
R1=65    R2=82    R3=91    R4=58    R5=61    R6=69    R7=82    R8=50
R9=-17   R10=53   R11=43   R12=36   R13=68   R14=94   R15=63

SPR-920D Analyzer System for Phosphor
Spectroradiometric made by
Zhejiang University Sensing Instruments Co., Ltd.

FIG. 6

WARM-WHITE LIGHT-EMITTING DIODE AND ITS PHOSPHOR POWDER

FIELD OF THE INVENTION

The present invention relates to the field of microelectronics and lighting technology, and in particular to a modern technology field called solid state lighting, which brings about gradual innovation with the heterojunction semiconductor light source based on In—Ga—N gradually replacing the light source of incandescent lamps and fluorescent lamps.

BACKGROUND OF THE INVENTION

Light-emitting diode (LED) was launched to the market in 1965 when engineers used GaAs as a basis to develop the first LED device. The LED device emits red light with a small power and a luminous flux $F \leq 0.01$ lumen. The development of LEDs was pretty slow in the 70s and 80s. Even in the early 90s, the luminous flux of a fine green LED did not exceed 0.1~0.3 lumen.

However, after the important invention of a Japanese professor, Shuji Nakamura, the LED development has seen acceleration. In the mid-90s, Nakamura proposed a new framework of nitride semiconductor for LED, whose substrate is based on Indium Nitride (InN) and Gallium Nitride (GaN). The unique feature of the semiconductor is that it comprises a large number of quantum wells in nanometer scales. The quantums are formed by adding oxygen as an activating agent during the synthetic process of the nitrides. Nakamura has summarized the process in one of his 1997 technical papers, Blue Laser (please refer to S. Nakamura, Blue laser, Springer Verlag, Berlin, 1997.).

Engineers in the Nichia company, which Nakamura has worked for previously, found a new application of blue LEDs, from which they developed a white-light semiconductor light. These Japanese engineers have developed the white-light LED based on the following known phenomena and frameworks. (1) The white light is generated according to the Newton Complementary Color Principle. (2) The two complementary colors, blue and yellow, are employed to generate uniform white light, which has been applied in the cathode ray tube CRT) of black-and-white television in the 40s. (3) The light-emitting surface of In—Ga—N heterojunction is spread with fluorescent powder with polymer adhesive; Bell company has previously employed a fluorescent powder layer to convert infrared emitted from a LED into visible light. (4) Properly choose the transparency and concentration of fluorescent powder layer so that the 20% first-order blue light of the light transmitting through the flourescent powder layer converting other blue light into yellow light radiation. (5) Use garnet containing yttrium aluminum and cerium as activating agent, i.e. $(Y,Ce)_3Al_5O_{12}$, as the substrate of the yllow fluorescent powder, which was developed by a well-known Dutch scholar G. B.asse for special radiolgical and electronic instruments in 1965.

Consequently, white LEDs based on the aforementioned material have been widely used since 1996.

FIG. 1 illustrates the structure of a conventional warm-white LED, which is consistent with the invention of the Japanese engineer Schimzu. The aforementioned light source comprises the following components: a radiation heterojunction (P-N junction) 1; two conducting wires 2, 3; a heat-conducting base based on sapphire ($Al_2O_3$) or silicon carbide (SiC) 4; a reflection holder 5; a light converter formed as a polymer covering layer 6, in which is distributed with fluorescent powder 7; and a light shield formed as a ball or cylindrical lens 8, inside which is disposed with transparent polymer layers 9.

In fact, all white LEDs have a framework similar to the aforementioned one with only slight changes, and thus the aforementioned structure can be regarded as all-purpose.

Although the aforementioned framework has been widely applied, there exists some substantive drawbacks: Non-uniform distribution of fluorescent powder in polymer layer leads to non-uniform brightness and color of light emitted from LEDs. The radiating edges of the nitride heterojunction do not have a covering layer, leading to a large amount of blue radiation. Also, the color temperature of LEDs is very high $T > 8000K$.

Many researchers have focused on solving the drawback of high color temperature, including U.S. Pat. No. 7,071,616 (refer to Schimizu Yetand U.S. Pat. No. 7,071,616). The patent discloses a LED with a low color temperature $T \approx 3800 \sim 6000K$, which is achieved by using a fluorescent powder emitting an orange-yellow light with chromaticity coordinates: $X > 0.49$ and $Y > 0.44$. This LED can emit normal white light with a color temperature $T \approx 4200 \sim 4800$ K. It characterized by the fact that its luminous intensity is very high, $I > 100$, at $2\theta = 6°$.

Although the aforementioned LED structure has many advantages, with regard to normal color temperature and high luminous intensity, the given scheme has a substantive drawback: its color temperature is different from that of an incandescent light source. The color temperature of an incandescent light source is $2850 \sim 4000K$. From the moment of inventing of incandescent lights 150 years ago, people's eyes have already used to the color temperature of this warm-white light source. The large amount of the red light in an incandescent light renders the surrounding objects with a natural color tone. In particular, human faces are comfortably illuminated, but they are somewhat un-natural under a fluorescent light. The drawback remains to be improved.

SUMMARY OF THE INVENTION

To overcome the aforementioned drawback, the main objective of the present invention is to provide a warm-white light-emitting diode (LED) and its fluorescent powder, which can reduce the amount of the first-order blue light emitted from the LED.

To overcome the aforementioned drawback, the main objective of the present invention is to provide a warm-white light-emitting diode (LED) and its fluorescent powder, which can create a semiconductor light source capable of emitting warm-white light with a color temperature $2800 < T < 4000K$.

To overcome the aforementioned drawback, the main objective of the present invention is to provide a warm-white light-emitting diode (LED) and its fluorescent powder, which can create a light source with higher brightness and larger luminous flux.

To overcome the aforementioned drawback, the main objective of the present invention is to provide a warm-white light-emitting diode (LED) and its fluorescent powder, which can create a warm-white light-emitting diode with a high luminous efficiency.

To achieve the aforementioned objectives, a warm-white light-emitting diode (LED) according to the present invention has the substrate of indium gallium nitride (InGaN) heterojunction containing a large amount of quantum wells and having a light conversion polymer layer, characterized by that the light conversion polymer layer is uniform in concentration, the light-emitting surface and edges of the indium gallium nitride heterojunction are covered with a thermosetting polymer, and the light conversion polymer layer contains some fluorescent powders, which are formed as at least two particle layers in the light conversion polymer layer to ensure the light transmitted reaching 20% of the first-order blle light and 70~80% of the second-order orange-yellow light from the indium gallium nitride heterojunction.

To achieve the aforementioned objectives, a fluorescent powder according to the present invention used in a warm-white light-emitting diode (LED) has the substrate of garnet cubic crystal structure with at least one of an $Ce^{+3}$ and $Pr^{+3}$ activating agent and is based on yttrium-gadolinium garnet containing ions of $B^{+3}$, $F^{-1}$, and $N^{-3}$ with its stoichiometric formula as $(Gd_{1-x-y-z}Y_xCe_yDy_z)_3Al_{5-p}B_pO_{12-q}(F,N)_q$.

BRIEF DESCRIPTION OF THE DRAWINGS

The present invention can be more fully understood by reference to the following description and accompanying drawings, in which:

FIG. 2 illustrates the spectrum analysis of a fluorescent powder with a composition of $(Gd_{0.82}Y_{0.15}Ce_{0.03})_3Al_{4.99}B_{0.01}O_{11.96}(F,N)_{0.04}$;

FIG. 3 illustrates the spectrum analysis of the fluorescent powder showing the peak wavelength shifted to $\lambda=572$ nm with Gd increased as $(Gd_{0.83}Y_{0.14}Ce_{0.03})_3Al_{4.99}B_{0.01}O_{11.98}(F,N)_{0.02}$;

FIG. 4 illustrates the spectrum analysis of the fluorescent powder showing the peak wavelength shifted to $\lambda=578.4$ nm with a substantial amount of Y being substituted with Gd as $(Gd_{0.87}Y_{0.10}Ce_{0.03})_3Al_{4.98}B_{0.02}O_{11.97}(F,N)_{0.03}$;

FIG. 5 illustrates the spectrum analysis of the fluorescent powder showing the peak wavelength of the gadolinium fluorescent powder shifted to $\lambda=579.1$ nm when the concentration of its Y ions is [Y]=5%; and FIG. 6 illustrates the spectrum analysis of the fluorescent powder showing the luminescent spectrum shifted to pure orange area with a peak wavelength $\lambda=582.3$ nm and the dominant peak wavelength being $\lambda=581$ nm when the concentration of its Y ions is [Y]=3%.

DETAILED DESCRIPTION OF THE PREFERRED EMBODIMENT

Figure 1:
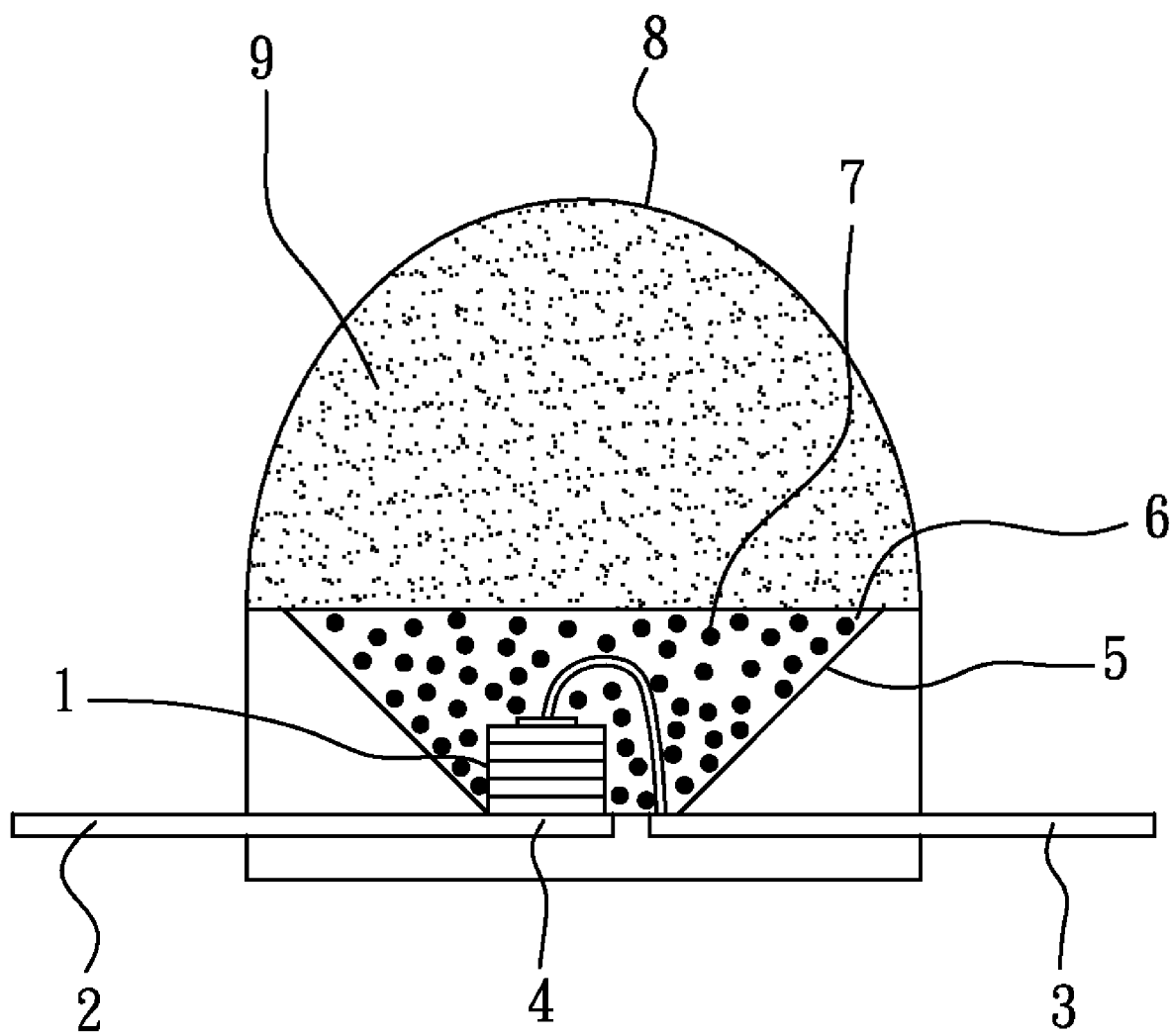
FIG. 1 illustrates a basic framework of a conventional warm-white light-emitting diode.

First of all, the objective of the present invention is to overcome the aforementioned overcomes. A warm-white light-emitting diode (LED) according to the present invention has the substrate of indium gallium nitride (InGaN) heterojunction containing a large amount of quantum wells and having a light conversion polymer layer, characterized by that the light conversion polymer layer is uniform in concentration, the light-emitting surface and edges of the indium gallium nitride heterojunction are covered with a thermosetting polymer, and the light conversion polymer layer contains some fluorescent powders, which are formed as at least two particle layers in the light conversion polymer layer to ensure the light transmitted reaching 20% of the first-order blue light and 70~80% from the second-order orange-yellow light of indium gallium nitride heterojunction, wherein the molecular weight of the thermosetting polymer layer is M>20000 g/mol; the mass fraction of the fluorescent particles is 5~60%; the fluorescent particles are formed as two or three layers of particle layers inside the light conversion polymer layer; and the color temperature of the entire warm-white light emitted from the warm-white LED is T=2800~3800K and its luminous efficiency is higher than 48 lm/w.

The fluorescent powder is an inorganic fluorescent powder having the substrate of garnet cubic crystal structure with at least one of an $Ce^{+3}$ and $Pr^{+3}$ activating agent and is based on yttrium-gadolinium garnet containing ions of $B^{+3}$, $F^{-1}$, and $N^{-3}$ with its stoichiometric formula as $(Gd_{1-x-y-z}Y_xCe_yDy_z)_3Al_{5-p}B_pO_{12-q}(F,N)_q$, wherein x=0.03~0.5, y=0.001~0.1, z=0.001~0.005, p=0.01~0.5, and q=0.001~0.10.; the most appropriate atomic fraction of Gd and Y is between 20:1~15:1; the peak wavelength of the inorganic fluorescent powder is $\lambda=571~582$ mm, its color temperature is T=2800~3800K, and its bandwidth is $\lambda_{0.5}=125~132$ nm; the inorganic fluorescent powder is made from oxides with halide and fluorite (mainly $BaF_2$, $AlF_3$, and $SrF_2$) mineralizers through a solid-state synthesis under a reduction atmosphere and a temperature of T=1400~1600° C. for 10~24 hours; and the average particle diameter of the inorganic fluorescent powder is $d_{cp} \leq 3$ μm, its median particle diameter is $d_{50} \leq 2.20$ μm, and $d_{90} \leq 8$ μm.

The following description is to explain the physical-chemical properties of the fluorescent powder according to the present invention. First of all, it is necessary to create a new luminous material to achieve the aforementioned objectives and thus to obtain the essential orange-yellow light and retain original stability during long-time heating. It is found that the standard fluorescent powder, $(Y, Ce)_3Al_5O_{12}$ with peak wavelength $\lambda=538$ nm was employed in the first-generation white LED. This kind of fluorescent powder has a very low lumen equivalency $Q_h=260$ lumen/w. It is possible for the fluorescent powder's peak wavelength to be shifted to $\lambda=538~560$ nm. The occurrence of such a wavelength shift is not because the use of yttrium-aluminum garnet (YAG), but of the garnet based on the solid solution of yttrium and gadolinium. In the mean time, the amount of gadolinium ions does not at most exceed 30~35% of the atoms in the $(Y,Gd,Ce)_3Al_5O_{12}$ added. Although many efforts have been put to increase the amount of gadolinium ions, no success has been made.

Later researchers have recognized that it is impossible to obtain pure YAG in practice. Therefore, attemps have been made to acquire synthetized product when materials in the forms of powder, single crystal, or thin film is demanded. In this period of time, no success has been reported in securing luminescent material with garnet structure, whose luminiscence lies in the orange or orange-yellow sub-energy band of the visible light spectrum, i.e. a wavelength of $\lambda_{max}=570$ nm. The luminescent garnet proposed in a previous invention by the present inventors has obtained a high chromaticity coordinates of $\Sigma(x+y)>0.94$ along with a color temperature T<4000K. In principle, the new garnet is based on gadolinium, instead of yttrium so that the $Ce^{+3}$ radiation can shift to right and eventually stop at the wavelength of $\lambda=580~585$ nm. Such a wavelength shift is not simple because of the complexity its crystal chemistry. The radius of $Ce^{+3}$ ion is $T_{Ce}=1.1~1.12$ Å, and thus the radius of $Gd^{+3}$ has to be low, $T_{Gd}=0.95$ Å for example. Such a radius difference, $\Delta_T=0.17$ Å, is close to the radius difference limit of solubility, $\Delta_T=\pm 15\%$, for similar ions in different compounds. Therefore, in creating a new fluorescent powder, one of the major complexities is to dissolve a certain amount of active ions $Ce^{+3}$ in a gadolinium-base garnet. The second complexity is to accommodate $Ce^{+3}$ ions in a garnet crystal with small lattice parameter, a=11.99~12.00 Å to replace a yttrium garnet with a larger lattice parameter, a=12.2 Å. It is necessary to "widen" the gadolinium garnet crystal structure to accommodate the required amount of different activating agents. The objective of the present invention is to resolve this difficulty.

The new fluorescent powder based on gadolinium garnet according to the present invention has a traditional cubic crystal structure which can accommodate cerium ions as well as gadolinium ions.

The focus of the present invention is an inorganic fluorescent powder used in LEDs. The fluorescent powder has the substrate of garnet cubic crystal structure with at least one of an $Ce^{+3}$ and $Pr^{+3}$ activating agent and is characterized by that the fluorescent powder is based on yttrium-gadolinium garnet containing ions of $B^{+3}$, $F^{-1}$, and $N^{-3}$ with its stoichiometric formula as $(Gd_{1-x-y-z}Y_xCe_yDy_z)_3Al_{5-p}B_pO_{12-q}(F,N)_q$, wherein, x=0.03~0.5, y=0.001~0.1, z=0.001~0.005, p=0.01~0.5, and q=0.001~0.10.

There are four points regarding the creation of the aforementioned fluorescent powder. First, the compound according to the present invention is undoubtedly a gadolinium-group garnet, indicating that there is a large amount of gadolinium added into the new fluorescent powder. Second, the new fluorescent powder is a gadolinium garnet, in which the solid solution of yttrium ions is previously impossible. Third, the new fluorescent powder contains the solid solution of barium oxide ($B_2O_3$) in the aluminum oxide anionic subcrystal. Fourth, compared to the standard garnet, conventional oxygen coordination valences used in gadolinium or cerium ions are partially substituted by subcrystal anions $F^{-1}$ and $N^{-3}$ in the new fluorescent powder.

If the aforementioned substitutions can be categorized as isomorph or iso-valence, i.e. $Gd \leftrightarrow Y$ and $Al \leftrightarrow B$, the substitution of $O^{-2}$ by $F^{-1}$ or $N^{-3}$ is aliovalent. In the substitution process, the size of ions has an important role. If the substitution of $O \leftarrow F$ can be realized, the radius of $F^{-1}$ has to be larger than that of $O^{-2}$ ($\Delta_T=0.15$ Å). To achieve similar substitutions, the ions to substitute need to have larger radii than those to be substituted. The condition can be laid down as: $T_B=0.20$ Å $<T_{Al}=0.58$ Å and $T_{F-}=1.30$ Å $<T_{O-2}=1.32$ Å.

The present invention also considers the conditions of adding other elements into the new gadolinium-garnet cubic crystal. Part of the large particles of activatinq agent $Ce^{+3}$ is substituted by smaller $Dy^{+3}$ in the cationic subcrystal of the fluorescent powder.

All the new measures explain that the radiation of the new fluorescent powder is unique. FIG. 2 illustrates the spectrum analysis of the fluorescent powder with a composition of $(Gd_{0.82}Y_{0.15}Ce_{0.03})_3Al_{4.99}B_{0.01}O_{11.96}(F,N)_{0.04}$; it can be observed that the peak wavelength of the new fluorescent powder is λ=571 nm.

As shown in FIG. 3, when Gd concentration in the fluorescent powder is increased as $(Gd_{0.83}Y_{0.14}Ce_{0.03})_3Al_{4.99}B_{0.01}O_{11.98}(F,N)_{0.02}$, the peak wavelength is shifted toward the longer wavelength region as λ=572 nm.

As shown in FIG. 4, when a substantial amount of yttrium is substituted by gadolinium in the fluorescent powder as $(Gd_{0.87}Y_{0.10}Ce_{0.03})_3Al_{4.98}B_{0.02}O_{11.97}(F,N)_{0.03}$, the peak wavelength is shifted to λ=578.4 nm.

As shown in FIG. 5, when the concentration of its yttrium ions is [Y]=5% in the gadolinium garnet, the peak wavelength is λ=579.1 nm.

As shown in FIG. 6, when the concentration of its yttrium ions is [Y]=3%, the luminescent spectrum is shifted to the pure orange area with the peak wavelength λ=582.3 nm and the dominant peak wavelength λ=581 nm. Also, the spectrum is very wide with $λ_{0.5}$=131.6 nm and its lumen equivalence $Q_L$=295 lumen/w.

Such a spectrum shift occurring in a gadolinium garnet has not been reported elsewhere so far. The aforementioned fluorescent powders have a color temperature of T=2901~3133K with a high luminescent intensity (from 23000 to 25000 unit).

When the lowest concentration of yttrium ions is added into the gadolinium garnet, the substantive change is manifested in the warm-red sub-energy band. Indeed, when the concentration of yttrium ions added into the aluminum-yttrium garnet is reduced to 10% of its original concentration (atomic fraction), the orange region of the spectrum will show all these changes. Further, the inventors are to present their own assumption for the characteristics of the gadolinium garnet. First, certain solid solution is present in $Y_3Al_5O_{12}$—$Gd_3Al_5O_{12}$ and is a result of $Y^{+3}$ substituting $Gd^{+3}$, i.e. $(Y_{1-x}Gd_x)_3Al_5O_{12}$.

The condition for the equivalence includes same oxidation potential (+3) and the radius of yttrium and gadolinium ions are close. With the radiation wavelength peak value changing from λ=538 to 568 nm, the homoegenity of the solid solution can quickly extend x to the range of 0.85~0.30. In fact, with every 15% more of $Gd^{+3}$ ions added, the radiation spectrum of $Ce^{+3}$ ions can change by 1 nm. When a large amount of $Gd^{+3}$ with potent f-elements is added to form a coordination polyhedron with valence k=9, the solid solution $(Y_{1-x}Gd_x)_3Al_5O_{12}$ will separate into two insoluble solid solutions $(Y_{0.7}Gd_{0.3})_3Al_5O_{12}$ and $(Gd_{0.85}Y_{0.15})_3Al_5O_{12}$. The addition of gadolinium ions can even form mono-aluminate $GdAlO_3$, which can be easily obtained by synthesis at a relatively low temperature (1100~1200° C.). The additional phase of the aluminate accumulates all the added $Gd^{+3}$ ions, and thus the optical properties of the solid solution $(Y_{1-x}Gd_x)_3Al_5O_{12}$ are in fact unchanged with wavelength remained the same. However, the second phase of the existing rhombic structure hinders the photoluminescence of yttrium-gadolinium garnet. Thus, the luminous intensity of the solid solution decays gradually from X≈0.30. This is the reason why the systensis of yellow/green-yellow, orange-yellow, and orange gamets was not successful.

The time of phase aggregation for gadolinium-mono-aluminate takes a long time. The time is not enough for the occurrence of decomposition reaction:

$7GdAlO_3 \rightarrow Gd_3Al_5O_{12}+Gd_4Al_2O_9$

The condition of phases ratio is $Gd_2O_3/Al_2O_3$=2:1 for gadolinium garnet. It is necessary to point out that such a phase exists in gadolinium garnet only when temperature is higher than 1600° C. With increasing amount of Gd in $Gd_2O_3$, the amount of the phase is also increased. Also, $Ce^{+3}$ ions are not easily soluble in the phase, and thus the phase is in fact inactive in optical match.

Then, it is possible for permeable reaction to occur:

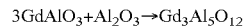

$3GdAlO_3+Al_2O_3 \rightarrow Gd_3Al_5O_{12}$

This reaction leads to single phase of gadolinium garnet $(Gd_{0.85}Y_{0.15})_3Al_5O_3$ and a few $Gd_2O_3$—$Y_2O_3$ in solid solution.

Consequently, in the rim of $Y_3Al_5O_{12}$—$Gd_3Al_5O_{12}$, there exist solid solutions of some different garnet structures, which are decomposed under the catalysts of the elements contained to form a second phase. Therefore, in the gadolinium-yttrium solid solution, the radiation can shift 30 nm, i.e. the change of spectrum by 12~14 nm in the gadolinium garnet.

It is necessary to point out that the gadolinium solution in yttrium garnet is rather heat resistant and can exist in a temperature as high as 1680~1750°C. On the other hand, yttrium solution rigorously decomposes in the temperature 1550~1580°C., clearly indicating the allowable temperature range for the synthesis of gadolinium garnet. The detailed characterization of the gadolinium-yttrium garnet and yttrium-gasolinium garnet is helpful for those experts intending to repeat the synthesis experiment for the warm-white LED described in the present invention.

The aforementioned description has pointed out that the single phase stability for gadolinium garnet can only be found in a specific concentration, which the most appropriate atomic ratio of Gd/Y is from 20:1 to 15:1. The concentration values obtained from experiments are crucial to achieve the best synthesis results.

It is noted that the aforementioned gadolinium garnet fluorescent powder has another characteristic, the aliovalent substitution of oxygen ions in the compound crystals. The simplest illustration of the substitution is $2O_o^{-2} = F_o^{-1} + N_o^{-3}$, wherein $O_o$ is oxygen ion in the oxide crystal, $F_o$ is fluorine ion in the oxide crystal, and $N_o^{-3}$ is nitrogen ion in the oxide crystal. It is possible for a aliovalent to have a more complex illustration. The substitution can also be realized on the basis of fluorescent powder, which is, to be more precise, in its anionic crystal, $Li^{+1}$ ion for example. A $Li^{+1}$ ion can be substituted by two fluorine ions, i.e. $(Li_{Al})'' = 2(F_o)^o$. If elements with higher positive valence, $Zr^{+4}$, $Hf^{+4}$, or $Si^{+4}$, are added into the garnet crystal, the addition of nitrogen ions into an oxide subcrystal seem very reasonable, $(Si_{Al})^o = (N_o)'$ for example. That is to say that a nitrogen ion is matched with a $Si^{+4}$.

It is an easy technique to add gadolinium-fluorine ions and gadolinium-nitrogen ions into a crystal. Gadolinium garnet should be undergone heat treatment and nitrogen compound, $NH_3$ or $Si_3N_4$ solid nitride, is decomposed in air.

The aliovalent substitution of gadolinium garnet has a very important characteristic: its brightness is substantially enhanced with the increasing fraction of $N^{-3}$. In term of geometric size, $N^{-3}$ is 1.5 times of $O^{-2}$, and therefore it is necessary to increase the amount of the radiation reconfiguratio on $Ce^{+3}$. In other words, it is to match with the increase of the brightness of fluorecent powder. An indirect way to achieve this is that the maximum atomic fraction for oxygen substitution is $q \leq 0.10$, but it is fine with $q \geq 0.01$. This is a very important characteristic of the aforementioned fluorescent powder.

During the present inventor's research works, it is found that the luminescent spectrum of the aforementioned flouorescent powder is unique. The emitted wavelength of the material in the yellow-orange and orange of the visible light spectrum is $\lambda = 571 \sim 582$ nm with the bandwidth changing from $\lambda 0.5 = 125$ nm to 132 nm. The color temperature of the fluorescent powder is $T = 2800 \sim 3200K$. Also, the visual brightness of luminescence is increased by ±20%. The characteristic of the fluorescent powder according to the present invention is that it is unusual for a rare earth garnet to emit yellow-orange light, close to the color of a mature apricot.

The aforementioned description has explained the major characteristics of the synthesis of the fluorescent powder according to the present invention, including oxygen-halide ingredients of oxides ($Gd_2O_3$, $Y_2O_3$, $CeO_2$, and $Dy_2O_3$) and fluorides ($BaF_2$ and $AlF_3$). Boric acid is used as exciting agent, and powder agglomerates and impurities are sieved away. The ingredients in the steel-aluminum crucible are pressed solid and put in a furnace with a reduction atmosphere containing hydrogen ($H_2$-5%, $N_2$-95%). The highest synthesizing temperature is $T = 1400 \sim 1600°C$. in $10 \sim 24$ hours of synthesis. The product is then cooled down in the crucible and is crushed and cleansed with nitride acid solution (5:1). During the synthesis processes, the flourescent particles form as thin film based on $ZnO \cdot SiO_2$ silicate.

The optical properties of the synthesized fluorescent powder based on gadolinium garnet and prepared by the aforementioned method are examined and shown in FIGS. 2 to 5. The particle size of the fluorescent powder corresponds to Gauss distribution, wherein the average diameter $d_{cp} \leq 3$ μm, median diameter $d_{50} \leq 2.20$ μm, and $d_{90} \leq 8$ μm.

Furthermore, the present invention discloses a fluorescent powder, which is, for example but not limited to, an inorganic fluorescent powder with the garnet cubic crystal containing at least one $Ce^{+3}$ and $Pr^{+3}$ activating agent. The fluorescent powder based on yttrium-gadolinium garnet which is added with $B^{+3}$, $F^{-1}$, and $N^{-3}$ ions and whose stoichiometric formula is $(Gd_{1-x-y-z}Y_xCe_yDy_z)_3Al_{5-p}B_pO_{12-q}(F,N)_q$, wherein $x = 0.03 \sim 0.5$, $y = 0.001 \sim 0.1$, $z = 0.001 \sim 0.005$, $p = 0.01 \sim 0.5$, and $q = 0.001 \sim 0.10$. The details can be seen in the aforementioned descriptions.

Consequently, the present invention can reduce the amount of first-order blue light emitted from the LED and also create a warm-white light source with a color temperature $2800 < T < 4000K$. Also, the present invention creates a light source with higher brightness and higher luminous flux, which can overcome the drawbacks of conventional warm-white LEDs.

It is appreciated that although the directional practice device of the present invention is used in a very limited space instead of practicing at the real playing field, effective and steady practice can be obtained as well. Further, it is very easy to set up and to operate the directional practice device of the present invention. These advantages are not possible to achieve with the prior art.

While the invention has been described with reference to the a preferred embodiment thereof, it is to be understood that modifications or variations may be easily made without departing from the spirit of this invention, which is defined by the appended claims.

What is claimed is:

1. A fluorescent powder used in a warm-white light-emitting diode (LED) has the substrate of garnet cubic crystal structure with at least one of an $Ce^{+3}$ and $Pr^{+3}$ activating agent and is based on yttrium-gadolinium garnet containing ions of $B^{+3}$, $F^{-1}$, and $N^{-3}$ with its stoichiometric formula as $(Gd_{1-x-y-z}Y_xCe_yDy_z)_3Al_{5-p}B_pO_{12-q}(F,N)_q$, wherein the stoichiometric coefficients are $x = 0.03 \sim 0.5$, $y = 0.001 \sim 0.1$, $z = 0.001 \sim 0.005$, $p = 0.01 \sim 0.5$, and $q = 0.001 \sim 0.10$, respectively.

2. The fluorescent powder as defined in claim 1, wherein the atomic ratio of Gd to Y is between $20:1 \sim 15:1$.

3. The fluorescent powder as defined in claim 1, wherein the peak wavelength of the fluorescent powder is $\lambda = 571 \sim 582$ nm, its color temperature is $T = 2800 \sim 3800K$, and its bandwidth is $\lambda_{0.5} = 125 \sim 132$ nm.

4. The fluorescent powder as defined in claim 1, wherein the inorganic fluorescent powder includes oxides with halide and fluorite mineralizers and the inorganic fluorescent powder is made through a solid-state synthesis under a reduction atmosphere and a temperature of $T = 1400 \sim 1600°$ C. for $10 \sim 24$ hours.

5. The fluorescent powder as defined in claim 1, wherein the average particle diameter of the inorganic fluorescent powder is $d_{cp} \leq 3$ μm, its median particle diameter is $d_{50} \leq 2.20$ μm, and $d_{90} \leq 8$ μm.

6. The fluorescent powder as defined in claim 4, wherein the halide and fluorite mineralizers are selected from the group consisting of $BaF_2$, $AlF_3$, and $SrF_2$.

* * * * *